United States Patent [19]

Mashiko

[11] Patent Number: 4,520,466
[45] Date of Patent: May 28, 1985

[54] DYNAMIC RANDOM ACCESS MEMORY

[75] Inventor: Koichiro Mashiko, Itami, Japan

[73] Assignee: Mitsubishi Denki Kabushiki Kaisha, Tokyo, Japan

[21] Appl. No.: 432,385

[22] Filed: Sep. 30, 1982

[30] Foreign Application Priority Data

Oct. 9, 1981 [JP] Japan .................................. 56-161608

[51] Int. Cl.³ ......................... G11C 7/00; G11C 11/40
[52] U.S. Cl. ..................................................... 365/210
[58] Field of Search ....................................... 365/210

[56] References Cited

U.S. PATENT DOCUMENTS

| 3,959,781 | 5/1976 | Mehta et al. | 365/210 |
| 4,136,401 | 1/1979 | von Basse | 365/210 |
| 4,195,357 | 3/1980 | Kuo et al. | 365/210 |
| 4,393,474 | 7/1983 | McElroy | 365/210 |

OTHER PUBLICATIONS

Stein, Karl U. et al., "Storage Array and Sense/Refresh Circuit for Single-Transistor Memory Cells", IEEE Journal of Solid-State Circuits, vol. SC-7, No. 5, Oct. 1972.

Primary Examiner—James W. Moffitt
Attorney, Agent, or Firm—Lowe, King, Price & Becker

[57] ABSTRACT

A dynamic random access memory comprises a one-transistor type MOS dynamic random access memory of an open bit line type, which comprises two memory arrays at the left and the right sides of sense amplifying circuits (2). Each of both memory arrays comprises a plurality of memory cells (1) and dummy cells (3), each of columns of memory cells (1) and dummy cells (3) having a cell plate voltage control circuit (13) connected at the end thereof through a cell plate (8). Each cell plate voltage control circuit (13) is provided with a control signal $\phi_G$ having a level changing during a period when any of word lines (5) or dummy word lines (6) is selected and is responsive to selection of the word line (5) or the dummy word line (6) to discharge the voltage of the cell plate (8) and is responsive to a change of the level of the control signal $\phi_G$ to charge the cell plate (8). Accordingly, transfer of a signal electric charge from the memory cell (1) and the dummy cell (3) to the bit line (4) is performed at a high speed, and delay of the signal of the word line (5) and the dummy word line (6) is compensated, whereby a high speed operation can be performed. In addition, a signal electric charge stored in the memory cells (1) and the dummy cells (3) is increased and the operation is accordingly stabilized.

9 Claims, 13 Drawing Figures

DYNAMIC RANDOM ACCESS MEMORY

BACKGROUND OF THE INVENTION

1. Field of the Invention

The present invention relates to a dynamic random access memory. More specifically, the present invention relates to a dynamic random access memory of an open bit line type employing a one-transistor type MOS dynamic random access memory.

2. Description of the Prior Art

In general, in a one-transistor type MOS dynamic random access memory the presence or absence of an electric charge stored in each of MOS capacitors is allotted to the logic zero or one, respectively, of two-value information. The electric charge stored in each MOS capacitor is transferred to a bit line by turning on a transfer gate. At that time a minor voltage change taking place at the bit line by virtue of the presence or absence of the electric charge in the MOS capacitor is detected by means of a sense amplifying circuit and the information is thus withdrawn. An MOS dynamic random access memory of an open bit line type has also been proposed wherein bit lines are disposed at the left and right sides of a sense amplifying circuit. One example of a dynamic random access memory of an open bit line employing one-transistor type MOS dynamic random access memory is disclosed in U.S. Pat. No. 4,061,954 issued Dec. 6, 1977 to Robert J. Proebsting et al. The example shown in the above referenced U.S. patent is directed to an improvement in a memory system having a dynamically balanced sense amplifier. The disclosure in the above referenced U.S. patent constitutes the background of the present invention and is incorporated herein by referring thereto. Nevertheless, for better understanding of the background of the present invention one example of a conventional MOS dynamic random access memory will be described in the following.

Figure 1:
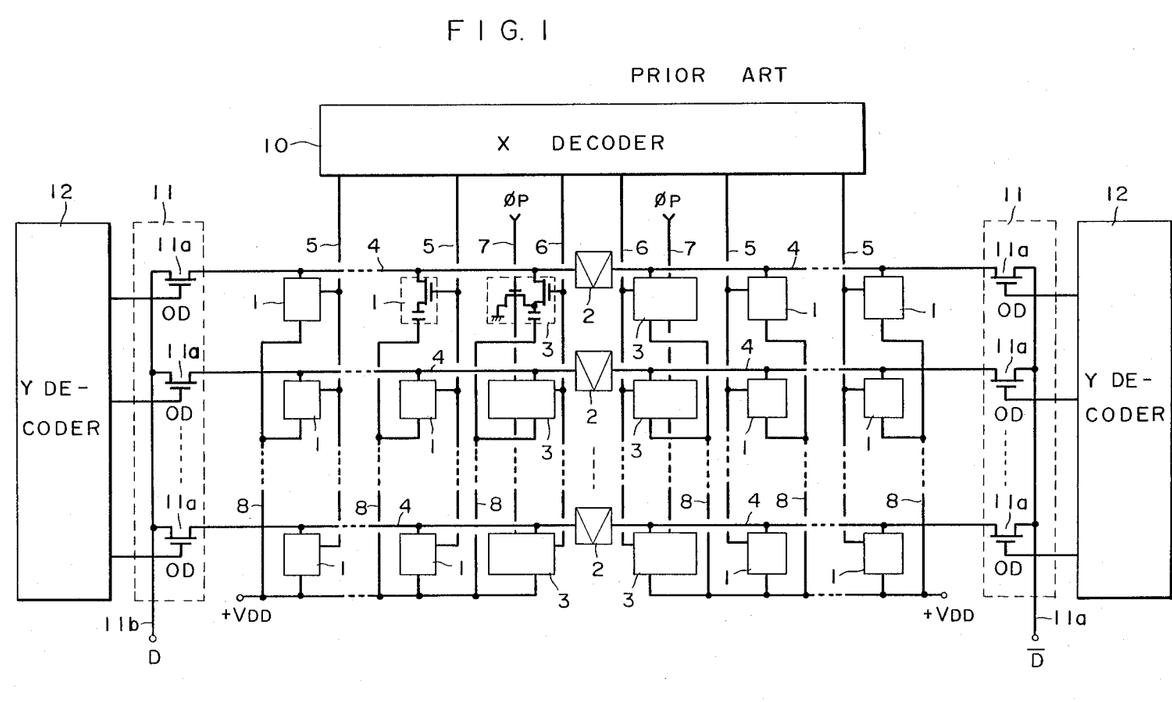
FIG. 1 is a block diagram showing a conventional MOS dynamic random access memory.

FIG. 1 is a block diagram showing a conventional MOS dynamic random access memory. A first and second memory arrays are provided at the left and right sides of sense amplifying circuits 2. More specifically, a plurality of bit lines 4 and a plurality of word lines 5 are disposed in an intersecting manner and memory cells 1 are provided at the respective intersections so as to be connected to the bit lines 4 and the word lines 5. The sense amplifying circuits 2 are provided at the central portion of the left and right bit lines 4. Columns of dummy cells 3 are provided at both adjacent sides of the sense amplifying circuits 2 and the dummy cells 3 are connected to the bit lines 4 and the word lines 6. The voltage source $+V_{DD}$ is supplied through the cell plates 8 to the columns of the memory cells 1 and the columns of the dummy cells 3. An X decoder 10 is connected to the word lines 5 and the dummy word lines 6 at one end of each of them. Gate circuits 11 are connected to the left and right bit lines 4, respectively, at one end of each line. Left and right Y decoders 12 are coupled to the left and right gate circuits 11, respectively. The X decoder 10 serves to select simultaneously one of the word lines 5 in the first memory array and the dummy word line 6 in the second memory array. The left and right Y decoders 12 each simultaneously select one out of the bit lines 4 in the first memory array and a corresponding one out of the bit lines 4 in the second memory array. Each of the gate circuits 11 comprises field effect transistors 11a each having one of conduction path electrodes connected to the corresponding one of the bit lines 4 and the other of the conduction path electrodes connected to a data bus 11b. The control electrode of each field effect transistor 11a is connected to the respective Y decoder 12. One of the field effect transistors 11a is turned on responsive to the Y decoder output OD from the Y decoder 12. Each of the memory cells undergoes a write and read operation of data. Each of the dummy cells 3 provides to the sense amplifying circuit 2 a reference potential. Each of the sense amplifying circuits 2 serves to detect and amplify a small potential difference between the signals from the memory cell 1 and the dummy cell 3.

Figure 2:
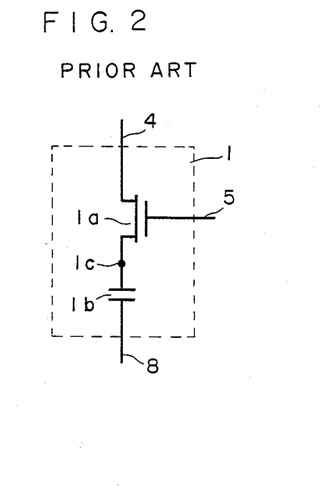
FIG. 2 is a schematic diagram of a conventional memory cell.

FIG. 2 is a schematic diagram of a conventional memory cell. The memory cell 1 comprises a transfer gate 1a and an MOS capacitor 1b. The transfer gate 1a comprises an N channel type MOS field effect transistor. It is pointed out that other transistors to be described in the present application may be a field effect transistor of the same type. Conduction path electrodes of the transfer gate 1a are connected between the bit line 4 and a memory terminal 1c. The MOS capacitor 1b is connected between the cell plate 8 and the memory terminal 1c. The word line 5 is connected to the control electrode of the transfer gate 1a. Storage of an electric charge in the MOS capacitor 1b or withdrawal of an electric charge from the MOS capacitor 1b, is performed during a time period when the transfer gate 1a is turned on.

Figure 3:
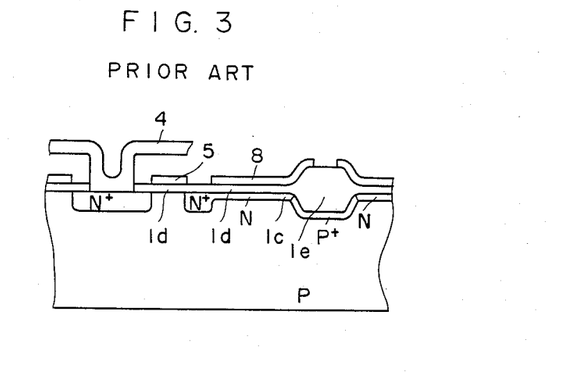
FIG. 3 is a sectional view of a conventional memory cell.

FIG. 3 is a sectional view of the conventional memory cell. The memory cell has the bit line 4 made of metal and the word line 5 made of an electrode material such as polysilicon. The reference character 1d denotes a gate oxide film. An MOS field effect transistor is formed at the left side portion of the memory cell and a memory capacitor is formed at the right side portion thereof. Each memory cell is mutually isolated by means of a field oxide film 1e.

Figure 4:
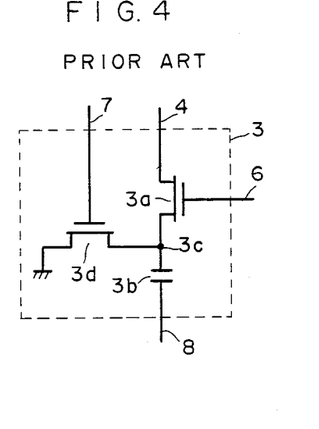
FIG. 4 is a schematic diagram of a conventional dummy cell.

FIG. 4 is a schematic diagram showing a conventional dummy cell. A dummy cell 3 comprises a transfer gate 3a, an MOS capacitor 3b and a gate 3d. A major difference thereof from the memory cell 1 resides in connection of a memory terminal 3c to the ground through the gate 3d and a capacitance of the MOS capacitor 3b being as small as approximately a half of the capacitance of the MOS capacitor 1b. The gate 3d is turned on or off responsive to the signal $\phi_P$ obtained from the $\phi_P$ line 7.

Figure 5:
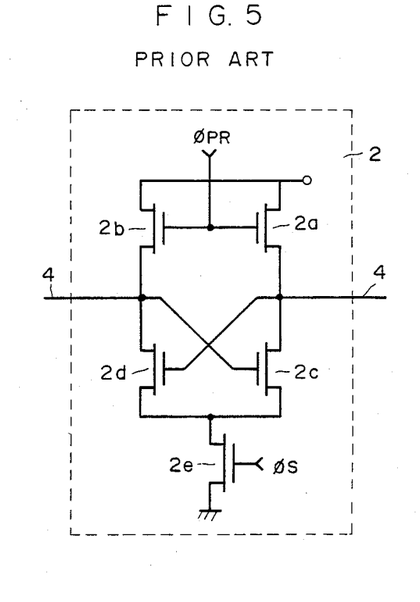
FIG. 5 is a schematic diagram of a conventional sense amplifying circuit.

FIG. 5 is a schematic diagram showing a conventional sense amplifying circuit. The sense amplifying circuit 2 comprises field effect transistors 2a, 2b, 2c, 2d and 2e. The control electrodes of the field effect transistors 2c and 2d are each coupled to one of the conduction path electrodes of the opposite one, respectively, in a crossing manner. The junctions of such crossing connections are each coupled to the voltage source through the field effect transistors 2a and 2b, respectively, and are also connected to the left and right bit lines 4. A precharge signal $\phi_{PR}$ for precharging is applied to the control electrodes of the field effect transistors 2a and 2b. The other of each of the conduction path electrodes of the field effect transistors 2c and 2d is connected to the ground through the field effect transistor 2e. The control electrode of the field effect transistor 2e is supplied with a signal $\phi_S$. The sense amplifying circuit 2 serves to amplify a small potential difference developed between the left and right bit lines 4 to the distinct high level or the low level at the timing of the signal $\phi_S$.

Figure 6:
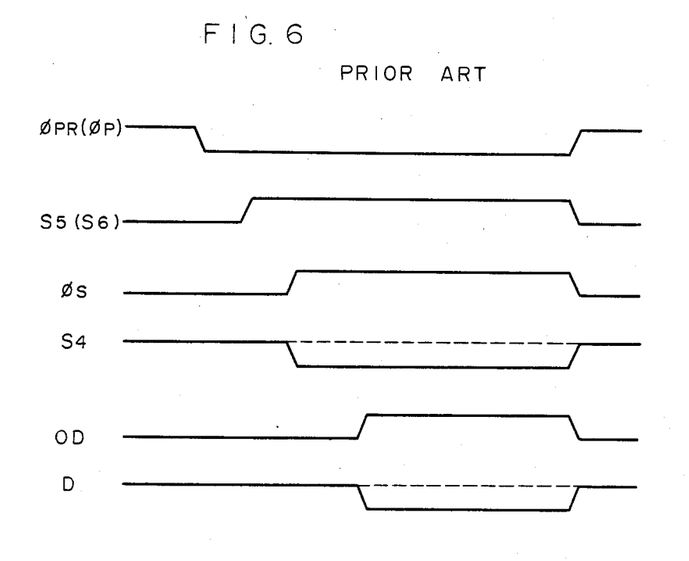
FIG. 6 is a timing diagram showing a conventional read mode operation.
Figure 7:
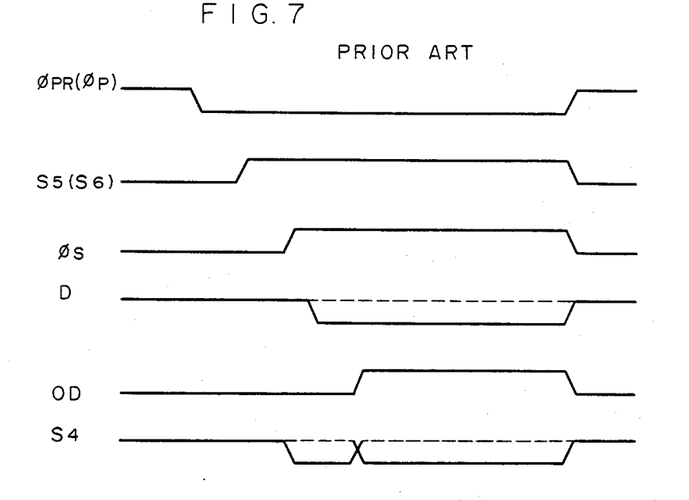
FIG. 7 is a timing diagram showing conventional write mode operation.

Now an overall operation of the conventional MOS dynamic random access memory shown in FIG. 1 will be described with reference to FIGS. 6 and 7. FIG. 6 is a timing diagram showing an operation of the memory in a read mode and FIG. 7 is a timing diagram showing an operation of the memory in a write mode. First referring to FIG. 6, the reference character $\phi_{PR}$ denotes a precharge signal applied to the sense amplifying circuit 2, the reference character $\phi_P$ denotes a signal applied to the dummy cells 3, the reference character $\phi_S$ denotes a signal applied to the sense amplifying circuit 2, the reference character S5 denotes a word line signal applied to the word lines 5, the reference character S6 denotes a dummy word line signal applied to the dummy word lines, the reference character S4 denotes a bit line signal applied to the bit lines 4, the reference character OD denotes a decoder output from the Y decoder 12, and the reference character D denotes the data applied to the data bus 11b. During a non-precharge period, the signals $\phi_{PR}$ and $\phi_P$ assume the low level. During that time period, the word line signal S5 and the dummy word line signal S6 simultaneously assume the high level, so that one of the word lines 5 in the left memory array and the dummy word line 6 of the right memory array, for example, are simultaneously selected. As a result, a signal electric charge is transferred from the memory cell 1 and the dummy cell 3 of the corresponding left and right bit lines 4. During substantially the same period of time the signal $\phi_S$ assumes the high level and, in the case where no electric charge is stored in the MOS capacitor 1b in the memory cell 1, for example, the signal S4 of the left side bit line 4 assumes the zero level and the signal S4 of the right side bit line 4 assumes the high level. During that period of time the Y decoder output OD becomes the high level and the data D of the logic zero is obtained from the left side data bus 11b, while the data $\overline{D}$ of the logic one is obtained from the right side data bus 11b, in a complementary manner. As a result, the logic zero is read from the memory cell 1. In the case where no electric charge is stored in the MOS capacitor 1b, a situation, becomes reversed to the above described situation, so that the logic one is read from the memory cell 1.

Now referring to FIG. 7, the changes of the precharge signal $\phi_{PR}$, the signal $\phi_P$, the word line signal S5, the dummy word line signal S6, and the signal $\phi_S$ are the same as described previously. When the signal $\phi_S$ becomes the high level, the bit line signal S4 becomes the low level or the high level depending on the presence or absence of an electric charge stored in the MOS capacitor 1b of the memory cell 1. When the data D applied to the left side data bus 11b becomes the logic zero, for example, and thereafter the Y decoder output OD becomes the high level, then the signal S4 of the left side bit line 4 becomes the low level and an electric charge is stored in the MOS capacitor 1b in the memory cell 1. Thus, the logic zero is written in the memory cell 1. In writing logic one in the memory cell 1, the operation is reversed to the foregoing.

In the case of the above described conventional MOS dynamic random access memory, the quantity of the signal electric charge transferred to the bit line 4 when the voltage of the cell plate 8 reaches the $V_{DD}$ level is $C_S(V_{DD}-V_T)$, where $C_S$ is the capacitance of the MOS capacitor 1b and $V_T$ is a threshold voltage of the transfer gate 1a. However, due to an increased degree of large scale integration, an increased value of capacity and a decreased value of voltage in recent MOS dynamic random access memories, it became difficult to secure sufficient values of $C_S$ and $V_{DD}$ and thus the quantity of a signal electric charge became small and an operating margin became accordingly narrower. In addition, with an increased capacity of such MOS dynamic random access memory, stray capacitance and resistance of the word lines 5 have increased, which delays the word line signal and hence delays a read operation at the end portion of the memory, which makes difficult a high speed operation. Accordingly, it has been desired that an MOS dynamic random access memory is provided which has an ample quantity of a signal electric charge and is capable of a high speed operation in spite of an increased capacity.

SUMMARY OF THE INVENTION

In summary, the present invention comprises a dynamic random access memory, including: a first and second memory arrays each having a plurality of memory cells and a plurality of dummy cells, a plurality of sense amplifying circuits for detecting and amplifying a potential difference between the bit lines in the first and second memory arrays, word line selecting means for simultaneously selecting one of the word lines in the first memory array and the dummy word line in the second memory array, bit line selecting means for simultaneously selecting the corresponding one of the bit lines in the first and second memory arrays, first cell plate voltage control means responsive to selection of the word line for bringing the voltage of the cell plate of the memory cells to the first level and responsive to the control signal applied externally for bringing the voltage of the cell plate to the second level, and second cell plate voltage control means for controlling the voltage of the cell plate of the dummy cell in the same manner at the same timing as those of control of the voltage level of the cell plate of the memory cell.

According to the present invention, when the word line is selected at a first half portion of the non-precharge period, the word line signal rises from the end close to the word line selecting means and the rise of the word line signal at the opposite end thereof is delayed. However, the voltage of the cell plate is discharged by the cell plate voltage control means in response to selection of the word line, when the voltage of the cell plate at the opposite end portion of the word line selecting means falls in a high speed. Exactly the same applies to the dummy word line. Accordingly, transfer of the signal electric charge from the memory cells to the bit line is performed in a high speed, whereby the delay of the word line signal is compensated. Since the voltage of the cell plate rises at the latter half portion of the non-precharge period, the potential of the MOS capacitor in the memory cell is boosted. Accordingly, an increased quantity of the signal electric charge is stored in the MOS capacitor, the operation margin is broadened and the operation is stabilized. Furthermore, since the potential of the MOS capacitor in the dummy cell is boosted in the same manner as that of potential of the MOS capacitor in the memory cell, capacitance of both MOS capacitors can be determined with simplicity and certainty.

Accordingly, a principal object of the present invention is to provide a dynamic random access memory capable of a high speed and stabilized operation in spite of an increased degree of large scale integration, an increased capacity, and a decreased voltage of voltage source of such random access memory.

An advantage of the present invention is to secure a high speed operation in spite of an increased capacity of such random access memory by compensating a delay of a word line signal.

Another advantage of the present invention is to secure a stabilized operation with a broadened operation margin in spite of an increased degree of large scale integration and a decreased voltage of a source voltage of such random access memory by increasing the quantity of a signal electric charge stored in memory cells.

A further advantage of the present invention is to determine with simplicity and certainty the capacitance of MOS capacitors in dummy cells in such random access memory without being influenced by uncertain factors.

Still a further advantage of the present invention is a decrease in the area of MOS capacitors in dummy cells in such random access memory to be as small as a half of the area of the MOS capacitors in the memory cells.

These object and other objects, features, aspects and advantages of the present invention will become more apparent from the following detailed description of the present invention when taken in conjunction with the accompanying drawings.

DESCRIPTION OF THE PREFERRED EMBODIMENTS

Figure 8:
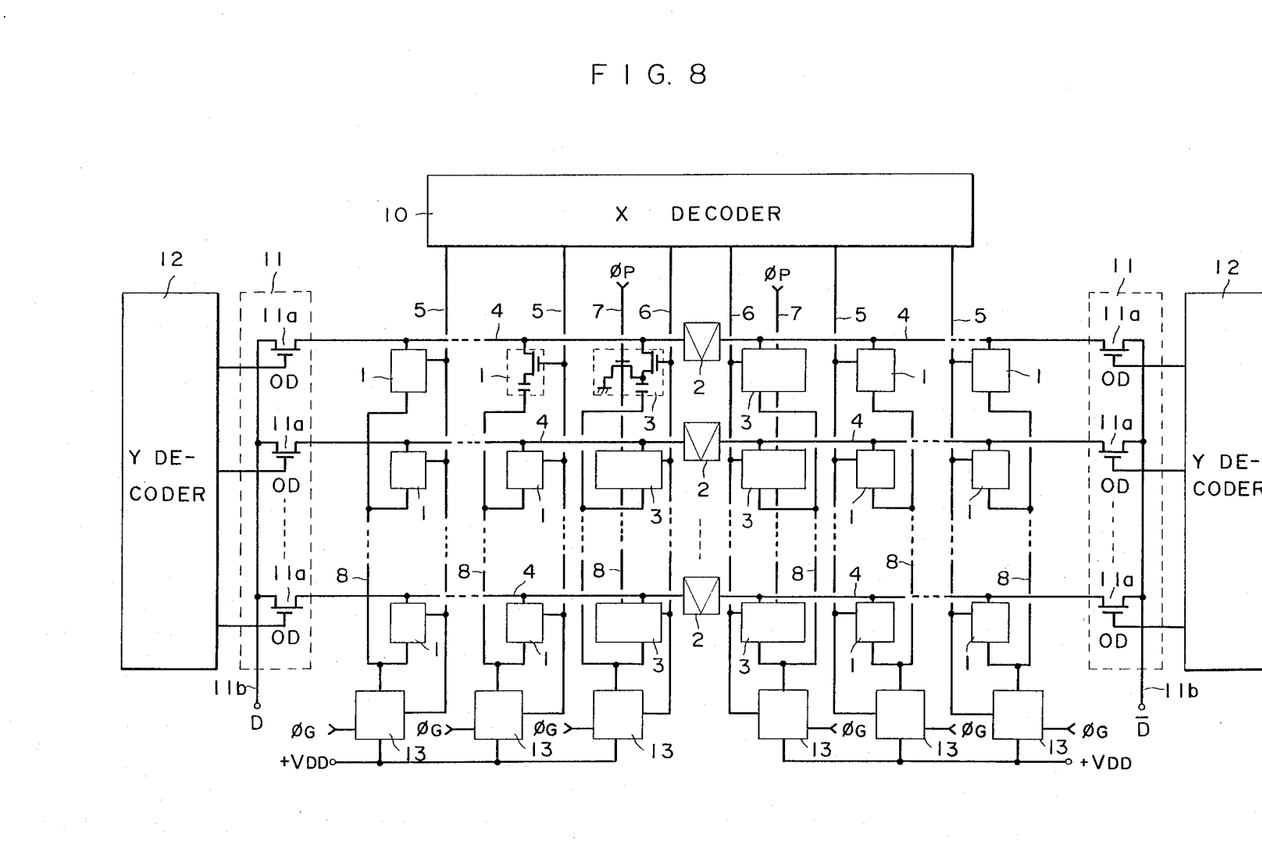
FIG. 8 is a block diagram of one embodiment of the present invention.

FIG. 8 is a block diagram showing one embodiment of the present invention. Now major differences of the FIG. 8 embodiment from the FIG. 1 conventional MOS dynamic random access memory will be described in the following. The embodiment shown additionally comprises cell plate voltage control circuits 13. Each of the cell plate voltage control circuits 13 is connected to the ends of the word lines 5 and the dummy word lines 6 which are opposite to the X decoder 10. Each of the cell plate voltage control circuits 13 is also connected to one end of the cell plate 8 and is supplied with the signal $\phi_G$ and the source voltage $+V_{DD}$. Each of the cell plate voltage control circuits 13 connected to the word lines 5 operates to charge or discharge the voltage of the cell plate 8, i.e. the cell plate voltage S8 as a function of the control signal $\phi_G$ and the word line signal S5 applied to the word lines 5. Each of the cell plate voltage control circuits 13 coupled to the dummy word lines 6 also operates to charge or discharge the cell plate voltage 8 as a function of the control signal $\phi_G$ and the dummy word line signal S6 applied to the dummy word lines 6.

Figure 9:
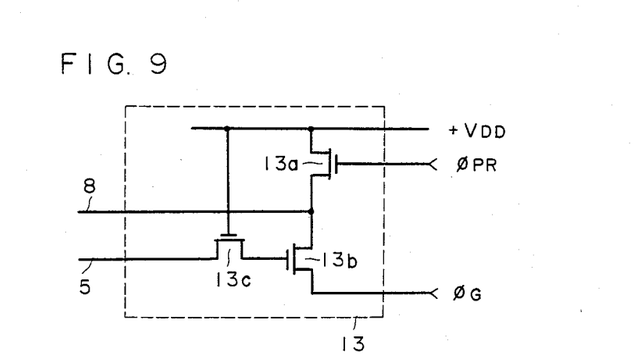
FIGS. 9 to 11 each show a schematic diagram of a cell plate voltage control circuit.
Figure 10:
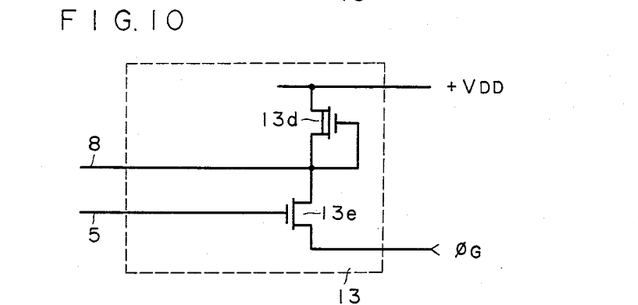
Figure 11:
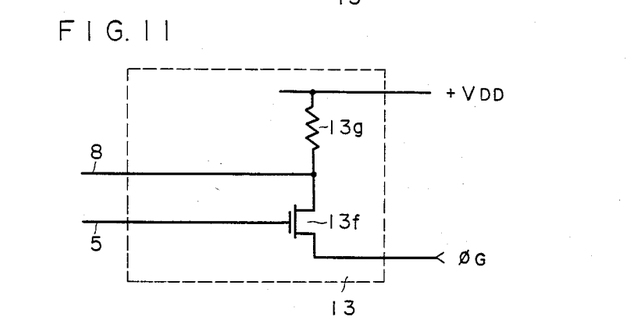

FIGS. 9 to 11 are views showing examples of such cell plate voltage control circuit 13. Referring to FIG. 9, the cell plate voltage control 13 comprises field effect transistors 13a to 13c of an enhancement type. One of the conduction path electrodes of the field effect transistor 13a is connected to one of the conduction path electrodes of the field effect transistor 13b and the junction thereof is connected to the cell plate 8. The other of the conduction path electrodes of the field effect transistor 13a is supplied with the source voltage $+V_{DD}$ and the control electrode thereof is supplied with the precharge signal $\phi_{PR}$. The other of the conduction path electrodes of the field effect transistor 13b is supplied with the control signal $\phi_G$ and the control electrode thereof is connected to one of the conduction path electrodes of the field effect transistor 13c. The other of the conduction path electrodes of the field effect transistor 13c is connected to the word line 5 and the control electrode thereof is supplied with the source voltage $+V_{DD}$. Referring to FIG. 10, the cell plate voltage control circuit 13 comprises a field effect transistor 13d of a depletion type and a field effect transistor 13e of an enhancement type. One of the conduction path electrodes and the control electrode of the field effect transistor 13d are connected to one of the conduction path electrodes of the field effect transistor 13e and the junction thereof is connected to the cell plate 8. The other of the conduction path electrodes of the field effect transistor 13d is supplied with source voltage $+V_{DD}$. The other of the conduction path electrodes of the field effect transistor 13e is supplied with the control signal $\phi_G$ and the control electrode thereof is connected to the word line 5. Referring to FIG. 11, the cell plate voltage control circuit 13 comprises field effect transistors 13f of an enhancement type and resistor 13g. One of the conduction path electrodes of the field effect transistors 13f is connected to one terminal of the resistor 13g and the junction thereof is connected to the cell plate 8. The other of the conduction path electrodes of the field effect transistor 13f is supplied with the control signal $\phi_G$ and the control electrode thereof is connected to the word line 5. The other terminal of the resistor 13g is supplied with the source voltage $+V_{DD}$.

Figure 12:
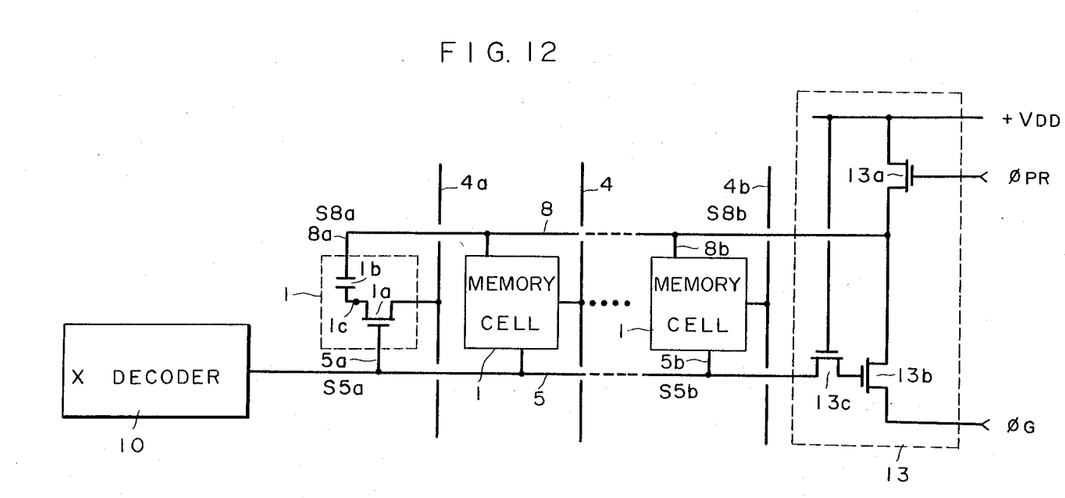
FIG. 12 is a block diagram showing one word line of the MOS dynamic random access memory shown in FIG. 8.
Figure 13:
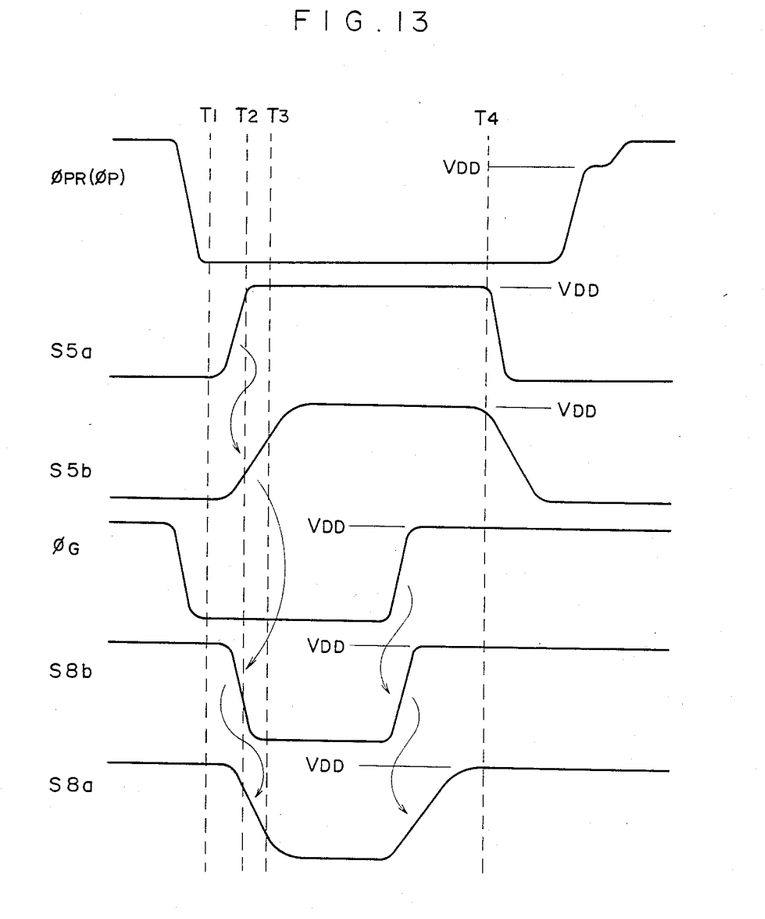
FIG. 13 is a graph showing waveforms of the signals at various portions in the FIG. 12 diagram.

Now an overall operation of the FIG. 8 embodiment will be described with reference to FIGS. 12 and 13. Although a description will be made in the following centering on the memory cell, it is pointed out that the dummy cell 3 is also controlled in exactly the same manner as that of the memory cell 1. FIG. 12 is a block diagram showing one word line of the MOS dynamic random access memory shown in FIG. 8. In FIG. 12, it is assumed that the cell plate voltage control circuit 13 is implemented as shown in FIG. 9. FIG. 13 is a graph showing waveforms of the signal at various portion of the FIG. 12 diagram. Referring to FIG. 12, the reference character $\phi_{PR}$ denotes a precharge signal applied to the cell plate voltage control circuit 13, the reference character S5a denotes a signal of the driving end of the word line 5a, the reference character S5b denotes a signal of the terminal end of the word line 5b, the reference character $\phi_G$ denotes a control signal applied to the cell plate voltage control circuit 13, the reference character S8b denotes a voltage of the discharge end of the cell plate 8b, and the reference character S8a denotes a voltage of the terminal end of the cell plate 8a. During a non-precharge period, the precharge signal $\phi_{PR}$ becomes the low level. Accordingly the field effect transistor 13a is turned off.

Now a description will be made of a case where the voltage of the cell plate 8 is discharged. When the word line 5 is selected by the X decoder 10, first the word line signal S5a rises and with a slight delay the word line signal S5b rises. On the other hand, the control signal $\phi_G$ has already become the low level and therefore the field effect transistors 13c and 13b are turned on, so that the voltage of the cell plate 8 charged with the source voltage $+V_{DD}$ in advance is discharged to the $\phi_G$ line 14 through the field effect transistor 13b. At that time first the cell plate voltage S8b rises and with a slight delay the cell plate voltage S8a falls. More specifically, since the word line signal S5a rises in a high speed in the memory cell 1 which is close to the X decoder 10, transfer of the electric charge of the signal from the memory cell 1 to the bit line 4 is performed in a high speed in spite of delay of the fall of the cell plate voltage S8a. Although the rise of the word line signal S5b is delayed in the memory cell 1 located far from the X decoder 10, i.e. close to the cell plate voltage control circuit 13, the cell plate voltage S8b falls in a high speed and therefore transfer of the electric charge of the signal from the memory cell 1 to the bit line 4 is similarly performed in a high speed. Thus, a delay of the word line signal is compensated.

Now a description will be made of a case where the cell plate 8 is charged. Charging of the cell plate 8 is performed by bringing the control signal $\phi_G$ to the high level after detection and amplification of the data by the sense amplifying circuit 2 or after a write operation and before the word line 5 is closed. First a description will be made of a case where the data of the logic one is written in the memory cell 1 before the control signal $\phi_G$ is brought to the high level. When the bit line 4a is brought to the source voltage $+V_{DD}$, transfer gate 1a is turned on since the word line signal S5a is the high level, whereby the electric charge starts to be stored in the MOS capacitor 1b. As a result, the potential at the memory terminal 1c increases and, when the potential reaches $(V_{DD} - V_T)$, the transfer gate 1a is turned off. Thus, the data of the logic one is written in the memory cell 1. When the control signal $\phi_G$ is thereafter brought to the high level and the cell plate voltage S8a is brought to the high level, the potential at the memory terminal 1c is increased accordingly to $(V_{DD} - V_T + \alpha V_{DD})$, where $\alpha$ is referred to as boost efficiency and normally is approximately 0.9. Meanwhile, after the lapse of the precharge period, again the word line signal S5a is increased and the cell plate voltage S8a is brought to the low level, when the potential at the memory terminal 1c becomes $(V_{DD} - V_T)$.

Now a description will be made of a case where the data of the logic zero is written in the memory cell 1 before the control signal $\phi_G$ is brought to the high level. When the bit line 4a is brought to zero volt, the transfer gate 1a is turned on inasmuch as the word line signal S5a is the high level and the potential at the memory terminal 1c is $(V_{DD} - V_T)$, whereby the electric charge in the MOS capacitor 1b is discharged. Thus, the data of the logic zero is written in the memory cell 1. Thereafter the control signal $\phi_G$ is brought to the high level and the cell plate voltage S8a is brought to the high level; however, the potential of the bit line 4a is kept clamped to be zero volt by means of the sense amplifying circuit 2 and therefore the potential at the memory terminal 1c is maintained zero volt. After the lapse of the precharge period, again the word line signal S5a is increased and the cell plate voltage S8a is brought to the low level, whereby the potential at the memory terminal 1c becomes $-\alpha V_{DD}$. Thus, the potential difference at the memory terminal 1c between the case where the data of the memory cell 1 is the logic one and the case where the data of the memory cell 1 is the logic zero becomes $(V_{DD} - V_T + \alpha V_{DD})$, with the result that the signal electric charge of approximately $C_S(V_{DD} - V_T + \alpha V_{DD})$ is stored in the MOS capacitor 1b. It is recalled that, as described previously, the electric charge of the signal stored in the MOS capacitor 1b is $C_S(V_{DD} - V_T)$ in the case of the conventional MOS dynamic random access memory. Therefore, it would be appreciated that, according to the present invention, an electric charge of the signal is stored more by $C_S \cdot \alpha V_{DD}$ than the conventional one. Therefore, according to the present invention, an operating margin is broadened and an operation is stabilized. Furthermore, as is clear from the foregoing description, it is only to and from the selected word line 5 that charging or discharging is made of the cell plate voltage S8. The cell plate 8 of the memory cell not selected is maintained at the source voltage $+V_{DD}$ as a function of the precharge signal $\phi_{PR}$ during the precharge period.

Meanwhile, the cell plate voltage S8 of the dummy cell 3 is also controlled in exactly the same manner at the same timing as the cell plate voltage S8 of the memory cell by the dummy word line singal S6, the control signal $\phi_G$ and the signal $\phi_P$, as described previously. Therefore, according to the present invention, in addition to the above described features, the present invention makes it possible to determine with ease and certainty the capacitance of the MOS capacitor 3b in the dummy cell 3. More specifically, from the standpoint of stabilization and so on of the operation of the sense amplifying circuit 2, the quantity of electric charge of the signal stored in the dummy cell 3 need be as small as a half of the quantity of the electric charge of the signal stored in the memory cell 1. The quantity of electric charge of the signal stored in the memory 1 is represented as $C_S(V_{DD} - V_T + \alpha V_{DD})$, as described previously. On the other hand, if and when the dummy cell 3 is implemented in a conventional manner without providing the cell plate voltage control circuit 13, the quantity of electric charge of the signal stored in the dummy cell 3 is $C_D(V_{DD} - V_T)$, as described previously in conjunction with FIG. 1, where $C_D$ is capacitance of the MOS capacitors 3b and $V_T$ is a threshold voltage of the transfer gate 3a, which is equal to that of the transfer gate 1a.

Accordingly, the capacitance $C_D$ is expressed by the following equation:

$$C_D(V_{DD} - V_T) = \frac{1}{2} C_S(V_{DD} - V_T + \alpha V_{DD}) \quad (1)$$

$$C_D = \frac{1}{2} C_S \frac{V_{DD} - V_T + \alpha V_{DD}}{V_{DD} - V_T}$$

In this case, the values of the threshold voltage $V_T$ and the boost efficiency $\alpha$ are diversified depending on the manufacturing conditions and it is difficult to determine with certainty the value of the capacitance $C_D$. Furthermore, since the threshold voltage $V_T$ is small and the boost efficiency $\alpha$ is approximately 0.9, it is necessary to make the value of the capacitance $C_D$ to be approximately equal to the value of the capacitance $C_S$, as is appreciated from the equation (1). However, since the cell plate voltage control circuit 13 is also provided in the dummy cell 3 in the present invention, the quantity of electric charge of the signal stored in the dummy cell 3 is $C_D(V_{DD}-V_T+\alpha V_{DD})$, as in the case of the memory cell 1. Accordingly, the capacitance $C_D$ is given by the following equation:

$$C_D(V_{DD}-V_T+\alpha V_{DD})=\tfrac{1}{2}C_S(V_{DD}-V_T+\alpha V_{DD}) \qquad (1)$$

$$C_D=\tfrac{1}{2}C_S \qquad (2)$$

As is clear from the equation (2), the value of the capacitance $C_D$ is determined without being influenced by the threshold voltage $V_T$ and the boost efficiency $\alpha$ and in addition the same may be as small as a half of the value of the capacitance $C_S$. Accordingly, the area of the MOS capacitor 3b in the dummy cell 3 may be a half of the area of the MOS capacitor 1b in the memory cell 1. Thus, capacitance of the MOS capacitor 3b in the dummy cell 3 can be determined with simplicity and with certainty.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic random access memory, comprising:
    a first and second memory arrays, each including
        a plurality of a word lines (5), a plurality of bit lines (4), and a single dummy word line (6),
        a plurality of memory cells (1) provided at the intersections between said word lines (5) and said bit lines (4) for writing therein and reading therefrom the data, said memory cells (1) coupled to each word line (5) constituting a column of memory cells,
        a plurality of dummy cells (3) coupled at the intersections between said dummy word lines (6) and said bit lines (4) for supplying a reference potential, said dummy cells (3) coupled to each said dummy word line (6) constituting a column of dummy cells,
        a first cell plate (8) coupled to each of said columns of memory cells (1) for supplying a source voltage ($+V_{DD}$) to said columns, and
        a second cell plate (8) coupled to said columns of dummy cells (3) for supplying said source voltage ($+V_{DD}$) to said columns,
    a plurality of sense amplifying circuits (2) each coupled to one end of each said bit line (4) in said first memory array and to one end of each said corresponding bit line (4) in said second memory array for detecting and amplifying a difference between the potential of each said bit line (4) of said first memory array and the potential of each said bit line (4) of said second memory array,
    word line selecting means (10) coupled to said word lines (5) and said dummy word lines (6) in said first and second memory arrays at one end of each thereof for selecting simultaneously one of said word lines (5) in said first memory array and said dummy word line (6) in said second memory array,
    bit line selecting means (11, 12) coupled to said bit lines (4) in said first and second memory arrays for simultaneously selecting one of said bit lines (4) in said first memory array and corresponding one out of said bit lines (4) in said second memory array,
    first cell plate voltage control means (13) coupled to the end of each said word line (5) of said first and second memory arrays opposite to the end where said word line selecting means (10) is connected and also coupled to said first cell plate (8) and being supplied with a control signal ($\phi_G$) having a level changing in a period when said word line (5) is selected and responsive to selection of the word line (5) for bringing the voltage of said first cell plate (8) to a first level and responsive to the change of the level of said control signal ($\phi_G$) for bringing the voltage of said first cell plate (8) to a second level which is different from said first level, and
    second cell plate voltage control means (13) coupled to the end of each said dummy word line (6) in said first and second memory array opposite to the end where said word line selecting means (10) is connected and also coupled to said second cell plate (8) and being supplied with said control signal ($\phi G$) and for controlling the voltage of said second cell plate (8) at the same timing in the same manner as the voltage level of said first cell plate (8) is controlled.

2. A dynamic random access memory in accordance with claim 1, wherein
    said first and second cell plate voltage control means (13) are structured in the same manner.

3. A dynamic random access memory in accordance with claim 2, wherein
    said first cell plate voltage control means comprises
        a first bidirectional gate means (13a) having a conduction path coupled to receive said source voltage ($+V_{DD}$) and to said first cell plate (8), and having a control portion supplied externally with a precharge signal ($\phi_{PR}$) for precharging, thereby to turn off the same for a non-precharge period as a function of said precharge signal ($\phi_{PR}$),
        second bidirectional gate means (13c) having a conductive path connected at one end to said word line (5) and having a control portion connected to receive said source voltage ($+V_{DD}$), and
        third bidirectional gate means (13b) having a conduction path connected at one end to said first cell plate (8) and supplied at the other end thereof with said control signal ($\phi_G$) and having a control portion coupled to the other of said conduction path of said second gate means (13c), thereby to turn on the same upon being selected by said word line selecting means (10).

4. A dynamic random access memory in accordance with claim 2, wherein
    said first cell plate voltage control means comprises
        resistor means (13d, 13g) coupled to receive said source voltage ($+V_{DD}$) and to said first cell plate (8), and
        fourth bidirectional gate means (13e) having a conduction path portion connected at one end thereof to said first cell plate (8) and supplied at the other end thereof with said control signal ($\phi_G$) and having a control portion connected to said word line (5), whereby the same is turned on upon being selected by said word line connecting means (10).

5. A dynamic random access memory in accordance with claim 4, wherein
said resistor means (13d, 13g) comprises an MOS field effect transistor (13d) having a conduction path portion connected to receive said source voltage ($+V_{DD}$) and to said first cell plate (8) and having a control portion connected to said first cell plate (8).

6. A dynamic random access memory in accordance with claim 4, wherein
said resistor means (13d, 13g) comprises a resistor (13g).

7. A dynamic random access memory in accordance with any one of the preceding claims 1 to 6, wherein each said memory cell (1) comprises
a first capacitor (1b) having one terminal connected to said first cell plate (8), and
fifth bidirectional gate means (1a) having a conduction path portion coupled to the other end of said first capacitor (1b) and to said bit line (4) and having a control portion coupled to said word line (5), whereby the same is turned on upon being selected by said word line selecting means (10), whereby said capacitor (1b) is connected to said bit line (4).

8. A dynamic random access memory in accordance with any one of the preceding claims 1 to 6, wherein each said dummy cell (3) comprises
a second capacitor (3b) having one terminal coupled to said second cell plate (8),
sixth bidirectional gate means (3a) having a conduction path portion coupled to the other end of said second capacitor (3b) and to said bit line (4) and having a control portion coupled to said dummy word line (6), whereby the same is turned on upon being selected by said word line selecting means (10), whereby said second capacitor (3b) is coupled to said bit line (4), and
seventh bidirectional gate means (3d) having a conduction path coupled to the other end of said second capacitor (3b) and to the ground and having a control portion supplied with a signal ($\phi_P$) of the same logic at the same timing as those of said precharge signal ($\phi_{PR}$) whereby the same is turned off during the non-precharge period.

9. A dynamic random access memory in accordance with any one of the preceding claims 3 or 4, wherein each said gate means (1a, 3a, 3d, 13a to 13f) comprises an MOS field effect transistor.

* * * * *